United States Patent
Yamada

(10) Patent No.: US 7,057,708 B2
(45) Date of Patent: Jun. 6, 2006

(54) PROJECTION OPTICAL SYSTEM, EXPOSURE APPARATUS AND DEVICE FABRICATION METHOD

(75) Inventor: Akihiro Yamada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/016,420

(22) Filed: Dec. 17, 2004

(65) Prior Publication Data

US 2005/0151950 A1   Jul. 14, 2005

Related U.S. Application Data

(63) Continuation of application No. PCT/JP03/08784, filed on Jul. 10, 2003.

(30) Foreign Application Priority Data

Jul. 11, 2002   (JP) .............................. 2002-202320

(51) Int. Cl.
  G03B 27/54   (2006.01)
  G03B 27/32   (2006.01)
  G03B 27/42   (2006.01)
  G02F 1/07    (2006.01)

(52) U.S. Cl. ..................... 355/67; 355/77; 355/53; 359/256

(58) Field of Classification Search ............. 355/53, 355/55, 67, 77; 117/1; 359/726, 256
See application file for complete search history.

(56) References Cited

U.S. PATENT DOCUMENTS

2003/0000453 A1 * 1/2003 Unno et al. .................... 117/1
2004/0105170 A1 * 6/2004 Krahmer et al. ............ 359/726

FOREIGN PATENT DOCUMENTS

WO   WO 03/009021   1/2003
WO   WO 03/009062   1/2003

OTHER PUBLICATIONS

European Patent Office, International Search Report dated Oct. 22, 2003 of PCT International Application No. PCT/JP03/08784, Filed Jul. 10, 2003.

John H. Burnett et al., "Intrinsic Birefringence in 157 nm Materials," Proceedings of the International Symposium on 157 nm Lithography, National Institute of Standards and Technology, pp. 1-13, May 15, 2001.

(Continued)

Primary Examiner—Peter B. Kim
(74) Attorney, Agent, or Firm—Morgan & Finnegan, LLP

(57) ABSTRACT

A projection optical system includes a first optical element that orients an axis [1 1 1] as a crystal orientation in a cubic system crystal parallel to an optical axis, and a second optical element that orients an axis [1 0 0] as the crystal orientation in the cubic system crystal so that a minimum angle may be 30° or larger between the optical axis and an off-axis edge beam that passes through the second optical element, and a minimum angle may be 10° or smaller between the optical axis and an off-axis principal ray that passes through the second optical element.

13 Claims, 8 Drawing Sheets

OTHER PUBLICATIONS

John H. Burnett et al., "Minimizing Spatial Dispersion Induced Birefringence in Crystals Used for Precision Optics by Using Mixed Crystals of Materials with the Opposite Sign of Birefringence," National Institute of Standards and Technology, pp. 1-2, Jul. 12, 2001.

John H. Burnett et al., "Intrinsic Birefringence in Calcium Fluoride and Barium Fluoride," Physical Review B, vol. 64, No. 24, American Institute of Physics., New York, U.S., pp. 241102-1-241102-4, Dec. 15, 2001.

* cited by examiner

PROJECTION OPTICAL SYSTEM, EXPOSURE APPARATUS AND DEVICE FABRICATION METHOD

This application claims a benefit of priority based on Japanese Patent Application No. 2002-202320, filed on Jul. 11, 2002, which is hereby incorporated by reference herein in its entirety as if fully set forth herein.

TECHNICAL FIELD

The present invention relates to projection optical systems, and more particularly to a projection optical system and an exposure apparatus for exposing an object, such as a single crystal substrate for a semiconductor wafer, and a glass plate for a liquid crystal display ("LCD"). However, the inventive projection optical system is not limited to an exposure apparatus, but may widely applicable to other optical equipment, such as photoengraving, measuring projection, moving picture projectors and other projectors.

BACKGROUND ART

As the need for smaller and thinner electronic apparatuses grows in recent years, finer semiconductor devices mounted in these electronic apparatuses have been increasingly demanded, and various proposals have been made for higher exposure resolution to fulfill this demand.

Since a shorter wavelength of an exposure light source is one effective means for higher resolution, recent exposure light sources have shifted from a g-line (with a wavelength of about 436 nm) and an i-line (with a wavelength of about 365 nm) to a KrF excimer laser (with a wavelength of about 248 nm) and an ArF excimer laser (with a wavelength of about 193 nm). In the near future, use of an $F_2$ excimer laser (with a wavelength of approximately 157 nm) is expected to be promising.

A conventional optical element is available to an optical system down to a wavelength region for the i-line, but conventional optical glass cannot be used for such a wavelength region as covers the KrF and ArF excimer lasers and the $F_2$ laser due to its low transmittance. An optical system in an exposure apparatus that uses the excimer laser as a light source has commonly used an optical element made of quartz glass ($SiO_2$) or calcium fluoride ($CaF_2$) having larger transmittance to light with a shortened wavelength, and it has been considered that exposure apparatus that uses the $F_2$ laser as a light source necessarily uses an optical element made of calcium fluoride.

Calcium fluoride single crystal has been manufactured mainly by a crucible descent method or Bridgman method. This method fills highly purified materials of chemical compounds in a crucible, melts in a growth device, and gradually descends the crucible, thereby crystallizing the materials from the bottom of the crucible. The heat history in this growth process remains as a stress in calcium fluoride crystal. Calcium fluoride exhibits birefringence to the stress, and the residual stress deteriorates optical performance. Therefore, a heat treatment follows the crystal growth to remove the stress.

However, calcium fluoride includes a non-negligible amount of intrinsic birefringence that results from its crystal structure even in an ideal crystal that does not have internal stress.

FIG. 7 shows crystal axes in calcium fluoride as a cubic system where axes [1 0 0], [0 1 0] and [0 0 1] are interchangeable. Without influence of the intrinsic birefringence, the optical characteristic is so isotropic that light that propagates in the crystal is affected by variable influence according to its propagation directions.

The intrinsic birefringence of calcium fluoride is described with reference to FIGS. 8 and 9. FIG. 8 indicates a size of birefringence according to ray directions in the crystal. Referring to FIG. 8, the birefringence amount becomes zero to light that propagate along the axes [1 1 1], [1 0 0], [0 1 0] and [0 0 1]. The birefringence amount becomes such a maximum value to light that propagate along the axes [1 0 1], [1 1 0] and [0 1 1] as 12 nm/cm for the wavelength for $F_2$ laser. FIG. 9 indicates a phase advance axis distribution of the birefringence according to the light direction. When an optical system is made of such crystal, a wave front that contributes imaging changes according to polarization directions of incident light, and two split wave fronts approximately form double images. In other words, the intrinsic birefringence would deteriorate the imaging performance of the optical system.

As discussed, while the influence of the intrinsic birefringence varies according to light propagation directions in the crystal, a combination of plural crystals would be able to correct influence of the intrinsic birefringence. When crystal orientations are adjusted so that the light that has been incident upon first crystal in a phase advance direction may enter second crystal in a phase delay axis direction, the light that has passed through two crystals cancels out the advance and delay of the wave front. A conventional optical system in a projection exposure apparatus that uses calcium fluoride have accorded its crystal axis [1 1 1] with the optical axis of the optical system without exception. A method for correcting influence of the intrinsic birefringence has been proposed which accords the crystal axis [1 1 1] with the optical axis of the optical system, and adjusts an angle of the crystal around the optical axis. Another method for correcting influence of the intrinsic birefringence has been already proposed which combines calcium fluoride orienting a crystal axis other than the crystal axis [1 1 1] with calcium fluoride orienting the crystal axis [1 1 1], and adjusts an angle around the optical axis.

However, the amount of the intrinsic birefringence is in reverse proportion to the square of a wavelength and known to be, for example, 3.4 nm/cm for the wavelength of 193 nm of ArF excimer laser ("ArF wavelength") and 11.2 nm/cm for the wavelength of 157 nm of $F_2$ excimer laser ("$F_2$ wavelength"). For a shorter exposure wavelength, an angular adjustment around the optical axis is insufficient for correction to the crystal axis [1 1 1] of calcium fluoride and desired imaging performance. A glass material orienting a crystal axis other than the crystal axis [1 1 1], e.g., the crystal axis [1 0 0] has a difficulty to reduce the internal stress caused by the manufacture or birefringence resulting from the internal stress, causing deteriorated yield and increased cost.

DISCLOSURE OF INVENTION

Accordingly, it is an exemplary object of the present invention to provide a projection optical system, an exposure apparatus and a device fabrication method, which refrain from use of an optical element orienting a crystal axis other than the crystal axis [1 1 1] to restrain cost increase, and reduce influence of the intrinsic birefringence in the optical system to secure intended imaging performance.

A projection optical system of one aspect of the present invention includes a first optical element that orients an axis [1 1 1] as a crystal orientation in a cubic system crystal parallel to an optical axis, and a second optical element that orients an axis [1 0 0] as the crystal orientation in the cubic system crystal so that a minimum angle may be 30° or larger between the optical axis and an off-axis edge beam that passes through the second optical element, and a minimum angle may be 10° or smaller between the optical axis and an off-axis principal ray that passes through the second optical element. Here, the axis [1 0 0] is equivalent to axes [0 1 0], [0 0 1], [−1 0 0], [0 −1 0] and [0 0 − 1] in the instant application, and the axis [1 0 0] may be replaced with axes [0 1 0], [0 0 1], [−1 0 0], [0 −1 0] and [0 0 −1].

The first and second optical elements may be adapted rotatable around the optical axis. The cubic system crystal may be calcium fluoride. The number of first optical elements may be larger than the number of second optical elements. For example, the number of first optical elements is 10 or more, and the second optical elements is 5 or less, e.g., 3 or less or 1.

A projection optical system of another aspect of the present invention includes an optical element that orients an axis [1 0 0] as a crystal orientation in a cubic system crystal so that a minimum angle may be 30° or larger between the optical axis and an off-axis edge beam that passes through the optical element, and a minimum angle may be 10° or smaller between the optical axis and an off-axis principal ray that passes through the optical element.

A method of still another aspect of the present invention for correcting intrinsic birefringence in a projection optical system that includes plural optical elements of a cubic system crystal includes the steps of arranging one optical element in the plural optical elements that orients an axis [1 1 1] as a crystal orientation in the cubic system crystal is parallel to an optical axis, and arranging another optical element that orients an axis [1 0 0] as the crystal orientation in the cubic system crystal in the plural optical elements so that a minimum angle may be 30° or larger between the optical axis and an off-axis edge beam that passes through the other optical element, and a minimum angle may be 10° or smaller between the optical axis and an off-axis principal ray that passes through the other optical element. A method may further include one of the plural optical elements around the optical axis.

An exposure apparatus of still another aspect of the present invention includes an illumination optical system for illuminating a mask or reticle that forms a predetermined pattern, and the above projection optical system for imaging light from the illumination optical system.

A device fabricating method of still another aspect of the present invention includes the steps of exposing an object using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the embodiments with reference to accompanying drawings.

BRIEF DESCRIPTION OF DRAWINGS

FIG. 2 is a schematic sectional view of a projection optical system shown in FIG. 1, wherein

BEST MODE FOR CARRYING OUT THE INVENTION

Figure 1:
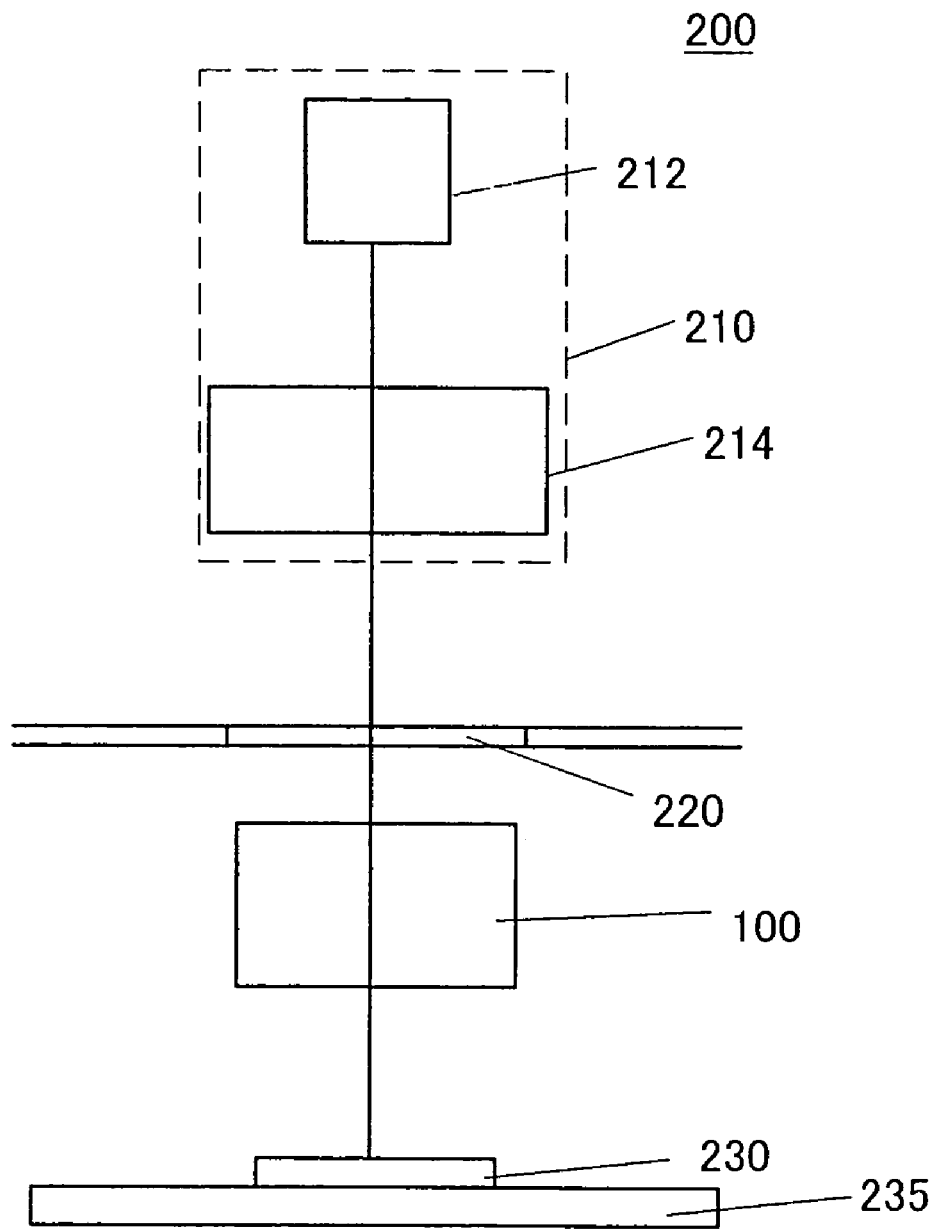
FIG. 1 is a schematic block diagram of an exposure apparatus of one embodiment according to the present invention.

A description will now be given of an exposure apparatus and method of one embodiment according to the present invention with reference to the accompanying drawings. The present invention is not limited to these embodiments and each element is replaceable within a scope that achieves the objects of the present invention. For example, while a projection optical system 100 and an exposure apparatus 200 of the present invention use laser for a light source, it may use lamps, such as a mercury lamp and a xenon lamp. The same reference numeral in each figure denotes the same element, and a description thereof will be omitted.

Here, FIG. 1 is a schematic block diagram of the exposure apparatus 200. The exposure apparatus 200 includes, as shown in FIG. 2, an illumination apparatus 210 that illuminates a reticle (mask) that forms a circuit pattern 220, and a projection optical system 100 that projects diffracted light from the illuminated mask pattern onto a plate 230.

The exposure apparatus 200 is a projection exposure apparatus for step-and-scan or step-and-repeat exposure of a circuit pattern formed on the reticle 220 onto the plate 230. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

The illumination apparatus 110 illuminates the reticle 220 that forms a circuit pattern to be transferred, and includes a light source section 212 and an illumination optical system 214.

The light source section 112 uses, for example, laser as a light source. The laser may be a KrF excimer laser with a wavelength of about 248 nm, an ArF excimer laser with a wavelength of about 193 nm, an $F_2$ excimer laser with a wavelength of approximately 157 nm, etc. However, a kind of laser is not limited to the excimer laser. For example, a YAG laser can be used, and the number of laser units is not limited. For example, if two units of solid laser that operates independently are used, no coherence between these solid laser units exists, and thus speckles arising from the coherence will be reduced considerably. Further, in order to reduce speckles, it would be advisable to swing an optical system in a straight or rotary manner. The light source section 212 that uses the laser preferably employ a beam shaping optical system for shaping a parallel beam from the laser light source to a desired beam shape, and an incoherently turning optical system for turning a coherent laser beam into an incoherent one.

The illumination optical system 214 is an optical system that illuminates the reticle 220, and includes a lens, a mirror, a light integrator, a stop, and the like, for example, in the order of a condenser lens, a fly-eye lens, an aperture stop, a condenser lens, a slit, and an image-forming optical system. The illumination optical system 214 can use any light whether it is axial or non-axial light. The light integrator may include a fly-eye lens or an integrator formed by stacking two sets of cylindrical lens array plates (or lenticular lenses), and be replaced with an optical rod or a diffractive element.

The reticle 220 is, e.g., of quartz, on which a circuit pattern (or an image) to be transferred is created, and is supported and driven by a reticle stage (not shown). Diffracted light emitted from the reticle 220 passes the projection optical system 100, and then, is projected onto the plate 230. The reticle 220 and the plate 230 are located in an optically conjugate relationship. The exposure apparatus 200 in this embodiment is a scanner, and scans the reticle 220 and the plate 230 to transfer a reduced size of a mask pattern onto the plate 230.

Figure 2A:
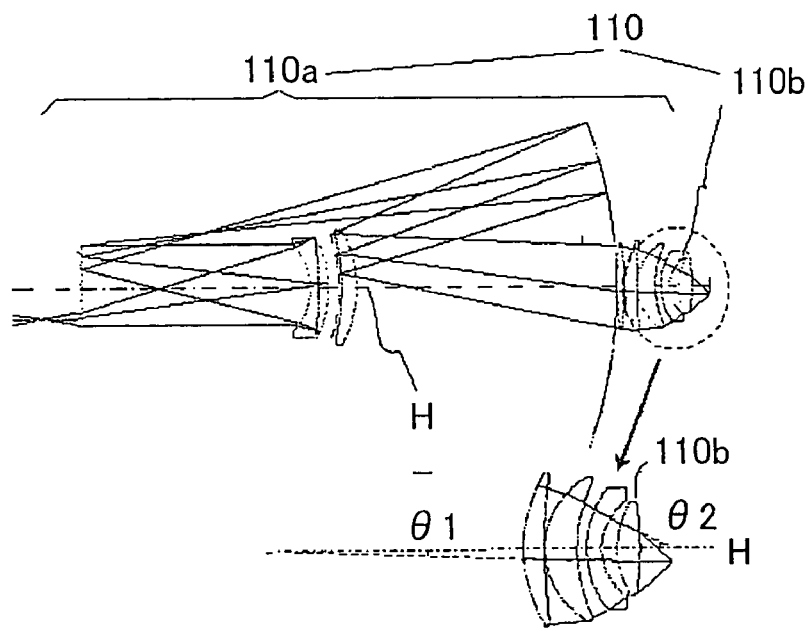
FIG. 2A is a view of an arrangement pattern of optical elements in the projection optical system.
Figure 2B:
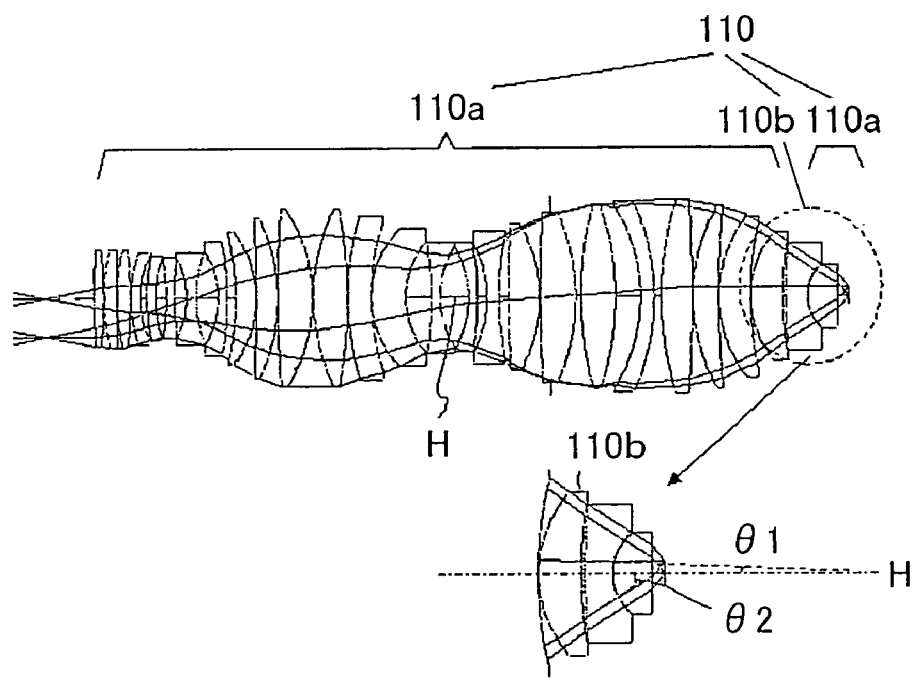
FIG. 2B is a view of another arrangement pattern of optical elements in the projection optical system.

The projection optical system 100 images light from an object surface (such as the reticle 220) onto an image surface (or an object to be processed, such as the plate 230). FIG. 2 is a schematic sectional view of the projection optical system 100, wherein FIG. 2A is a view of an arrangement pattern of the optical element 110 in the projection optical system 100, and FIG. 2B is a view of another arrangement pattern of the optical element 110 in the projection optical system 100. Although the actual projection optical system uses twenty or more optical elements, the projection optical system shown in FIG. 2 typifies a general excimer laser projection optical system for description convenience.

The optical element 110 images light using reflection, refraction and diffraction. The optical element 110 is held rotatably around an optical axis H. Therefore, the optical element 110 may adjust an angle around the optical axis H to reduce influence of the intrinsic birefringence. The optical element 110 includes, for example, a lens, parallel plate glass, prism, mirror, Fresnel zone plate, diffractive optical elements, such as a Kinoform, binary optics and hologram. A material of an optical element usable for an exposure apparatus that uses excimer laser includes, for example, calcium fluoride of a cubic system crystal.

Figure 3:
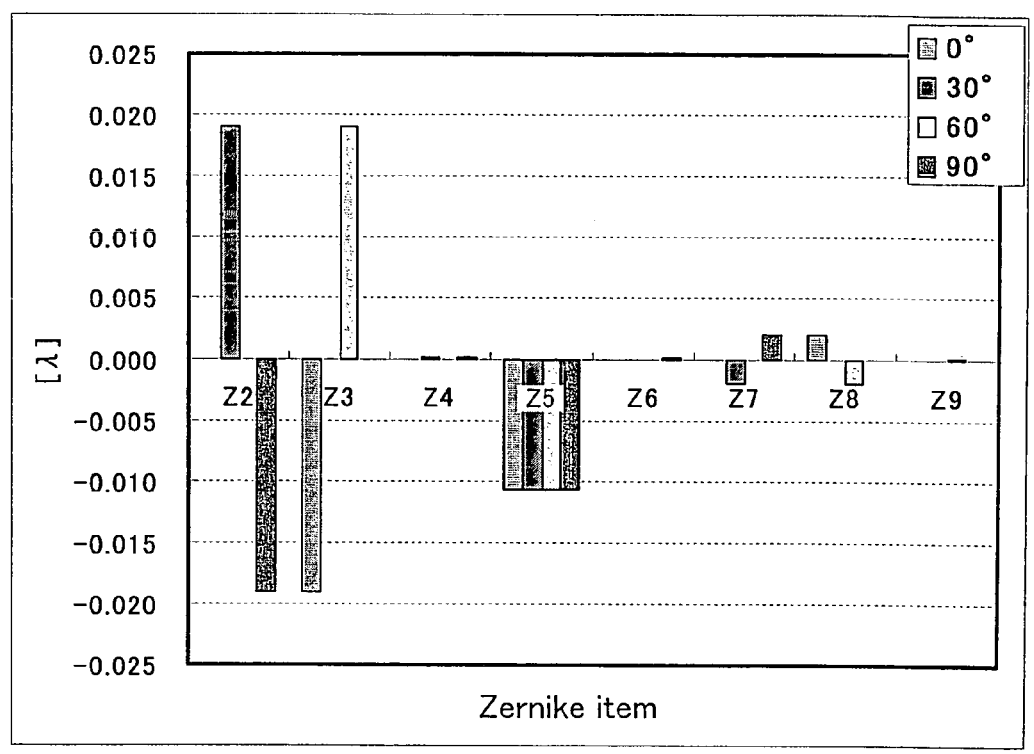
FIG. 3 is a graph of Zernike aberration to rotational angles around an optical axis, which occurs when X polarized light with a wavelength of 157 nm and a numerical aperture with 0.80 is incident upon a glass material that orients a crystal axis [1 1 1] having a thickness of 6.5 mm.

An optical element 110a arranges its axis [1 1 1] as a crystal orientation in a cubic system crystal parallel to the optical axis H. The term "parallel", as used herein, covers such slight inclinations relative to the optical axis H so that the axis may serve as if it is arranged parallel to the optical axis H. Thus, the optical element 110a is made of a glass material that orients a crystal axis [1 1 1]. For example, when X polarized light with a wavelength of 157 nm and a numerical aperture ("NA") with 0.80 is incident upon the optical element 110a having a thickness of 6.5 mm, Zernike aberration occurs as shown in FIG. 3, which results from the intrinsic birefringence. FIG. 3 is a graph of the Zernike aberration to rotational angles around the optical axis H, which occurs when the X polarized light is incident upon the glass material that orients a crystal axis [1 1 1], wherein the ordinate axis indicates the occurring Zernike aberration (λ) and the abscissa axis indicates a Zernike item.

Referring to FIG. 3, the aberration of the X polarized light, which occurs when the X polarized light is incident upon the optical element 110a, mainly includes tilt components Z2 and Z3 and astigmatic component Z5. Among them, a sign of the tilt components becomes inversed with a rotation around the optical axis H, and a proper combination of rotary angles would be able to correct the tile components. On the other hand, the astigmatic component occurs in the same direction with a rotation around the optical axis H, and a proper combination of rotary angles would not be able to correct the astigmatic component. The residual astigmatic component deteriorates the imaging performance as well as causing the increased difference of influential degree between pattern directions.

Figure 4:
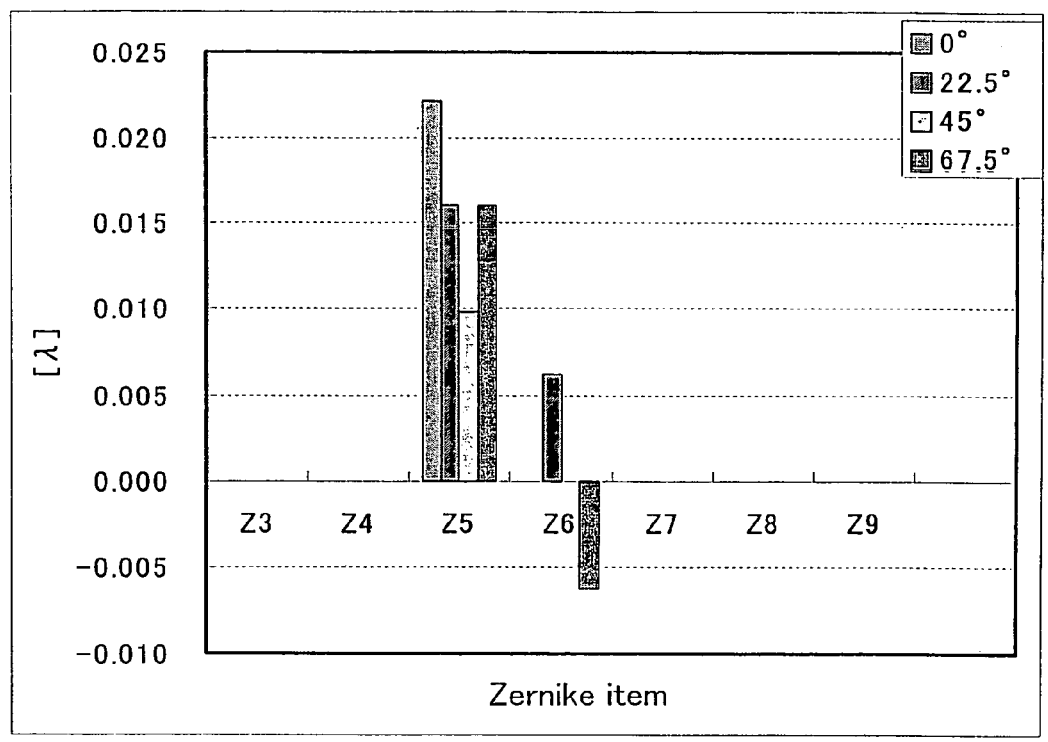
FIG. 4 is a graph of Zernike aberration to rotational angles around an optical axis, which occurs when X polarized light with a wavelength of 157 nm and a numerical aperture with 0.80 is incident upon a glass material that orients a crystal axis [1 0 0] having a thickness of 6.5 mm.

An optical element 110b arranges its axis [1 0 0] relating to the crystal orientation of the cubic system crystal parallel to the optical axis H. The term "parallel", as used herein, covers such slight inclinations relative to the optical axis H so that the axis may serve as if it is arranged parallel to the optical axis H. Thus, the optical element 110b is made of a glass material that orients a crystal axis [1 0 0]. For example, when X polarized light with a wavelength of 157 nm and a NA with 0.80 is incident upon the optical element 10b having a thickness of 6.5 mm, Zernike aberration occurs as shown in FIG. 4, which results from the intrinsic birefringence. FIG. 4 is a graph of the Zernike aberration to rotational angles around the optical axis H, which occurs when the X polarized light is incident upon the glass material with a crystal axis [1 0 0], wherein the ordinate axis indicates the occurring Zernike aberration (λ) and the abscissa axis indicates a Zernike item.

Referring to FIG. 4, the aberration of the X polarized light, which occurs when the X polarized light is incident upon the optical element 110b, is astigmatic component Z5. The astigmatic component Z5 of the optical element 110b (or a glass material that orients a crystal axis [1 0 0]) has a reverse sign to and may be corrected by the astigmatic component Z5 that occurs for the optical element 110a (or a glass material that orients a crystal axis [1 1 1]). Nevertheless, a tilt component occurs as the light that passes through the optical element 10b distorts, preventing efficient corrections. Accordingly, the instant embodiment uses, as shown in FIG. 2, the optical element 110b (or a glass material that orients a crystal axis [1 0 0]) for such a glass material as arranges not only a minimum angle of 30° or greater between the optical axis and the off-axis edge beam that passes through the glass material, but also a minimum angle of 10° or smaller between the optical axis and the off-axis principal ray that passes through the glass material.

A satisfaction of the condition that the optical element 110b (or a glass material that orients a crystal axis [1 0 0]) uses such a glass material that the minimum angle between the optical axis and the off-axis edge beam is greater than 30°, would make it be easily subject to influence of intrinsic birefringence, thereby making larger the astigmatism component. Therefore, the astigmatism may become easily corrected which has been generated in an optical element of a glass material that orients a crystal axis [1 1 1].

A satisfaction of the condition that the optical element 110b (or a glass material that orients a crystal axis [1 0 0]) uses such a minimum angle of 10° or smaller between the optical axis and the off-axis principal ray makes larger the astigmatism component and thus the astigmatism may become easily corrected. A dissatisfaction of this condition would make larger the tilt component. It is the astigmatism that should be corrected, and the above condition that makes larger the astigmatism would be desirable to efficient corrections of the astigmatism.

A high-quality optical element made of a glass material that orients a crystal axis [1 0 0], like the optical element 110b, is now further more difficult to manufacture than a glass material that orients a crystal axis [1 1 1]. Therefore, the number of optical elements made of a glass material that orients a crystal axis [1 0 0] should be preferably as small as possible. If possible, the number of optical elements made of a glass material that orients a crystal axis [1 0 0] is preferably 3 or smaller, more preferably 1. The number of optical elements made of a glass material that orients a crystal axis [1 1 1] may be 10 or greater, whereas the number of optical elements made of a glass material that orients a crystal axis [1 0 0] may be 5 or smaller.

The projection optical system 100 uses such an arrangement of the optical element 110 to restrain cost increase and efficiently correct influence of the intrinsic birefringence for intended resolution.

The projection optical system 100 of the instant embodiment includes an optical system that has, in order from the mask 220 to the plate (wafer) 230, a glass materials that orients a crystal axis [1 1 1] and a glass materials that orients a crystal axis [1 0 0], but the inventive projection optical system is not limited to this one. For example, the number of optical elements 210 is not limited, and the glass materials with crystal axes [1 1 1] and [1 0 0] may be differently arranged within the above scope. In the instant embodiment, the axis [1 0 0] is equivalent to axes [0 1 0], [0 0 1], [−1 0 0], [0 −1 0] and [0 0 −1] in the instant application, and the axis [1 0 0] may be replaced with axes [0 1 0], [0 0 1], [−1 0 0], [0 −1 0] and [0 0 −1]. Nevertheless, the instant embodiment uses a notation with the axis [1 0 0].

Turning back to FIG. 1, the plate 230 is a wafer in this embodiment, but may include a LCD and other object to be exposed. The photoresist is applied to the plate 230. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate stage 235 supports the plate 230. The plate stage 135 may use any structure known in the art, and thus a detailed description of its structure and operations will be omitted. For example, the plate stage 235 may use a linear motor to move the plate 230 in the XY directions. The reticle 220 and the plate 230 are synchronously scanned, for example, and positions of the reticle stage (not shown) and the plate stage 235 are monitored, for example, by a laser interferometer. The reticle stage (not shown) and the plate stage 235 may be driven at a constant speed ratio. The plate stage 235 is installed on a stage stool supported on the floor and the like, for example, via a dumper, and the reticle stage and the projection optical system 100 are installed on a lens barrel stool (not shown) supported, for example, via a dumper to the base frame placed on the floor.

In exposure, the light emitted from the light source section 212, for example, Koehler-illuminates the reticle 220 through the illumination optical system 214. Light that has passed through the reticle 220 and reflects the mask pattern, is imaged on the plate 230 by the projection optical system 100. The projection optical system 100 of the exposure apparatus 200 reduces the influence of the intrinsic birefringence and prevents deterioration of the imaging performance caused by the intrinsic birefringence. Accordingly, the exposure apparatus 200 may provide, with high precision and economy, devices (such as semiconductor devices, LCD devices, image pick-up devices (such as CCDs), thin film magnetic heads, and the like).

Figure 5:
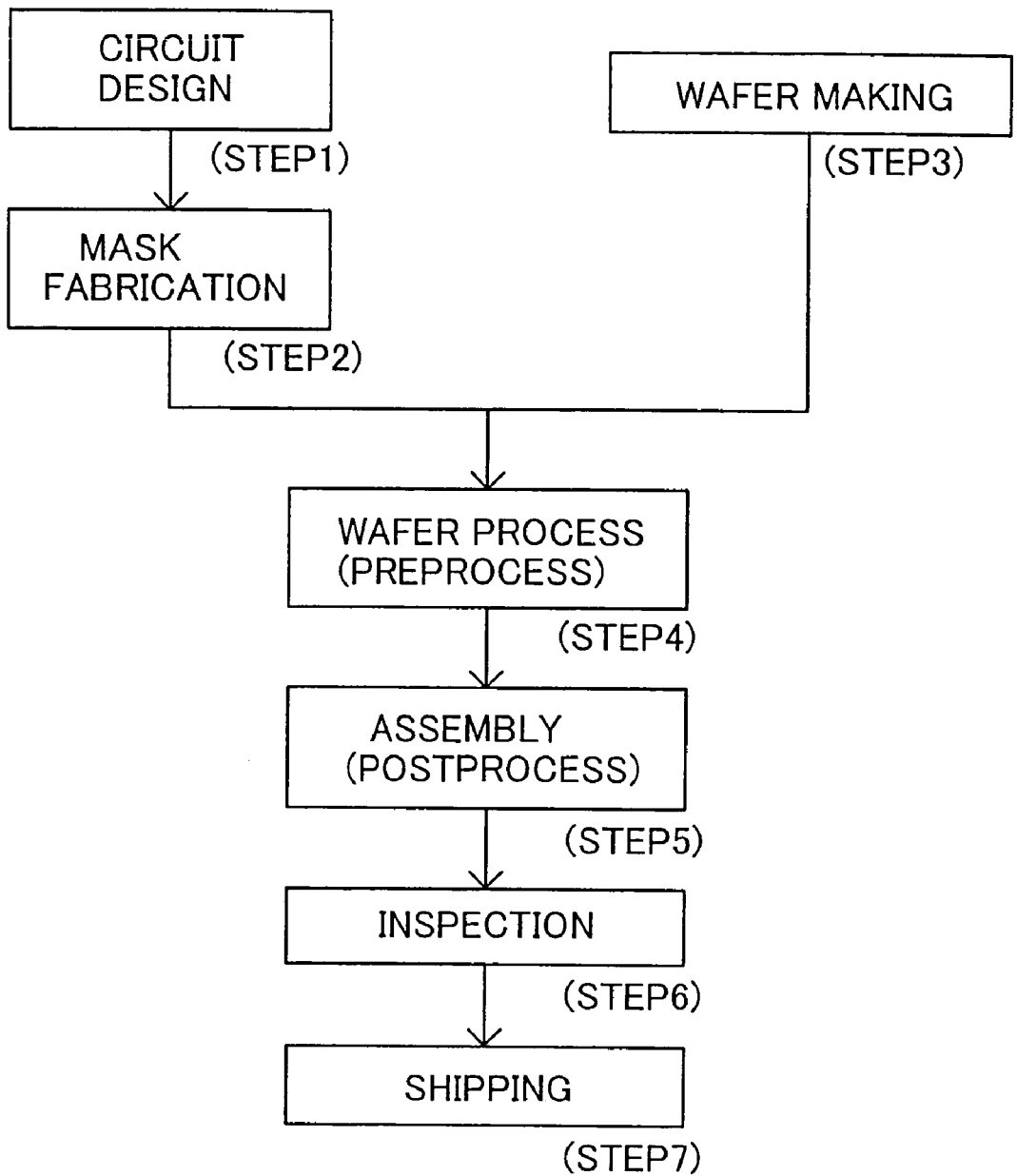
FIG. 5 is a flowchart for explaining how to fabricate devices (such as semiconductor chips such as ICs and LCDs, CCDs, and the like).
Figure 6:
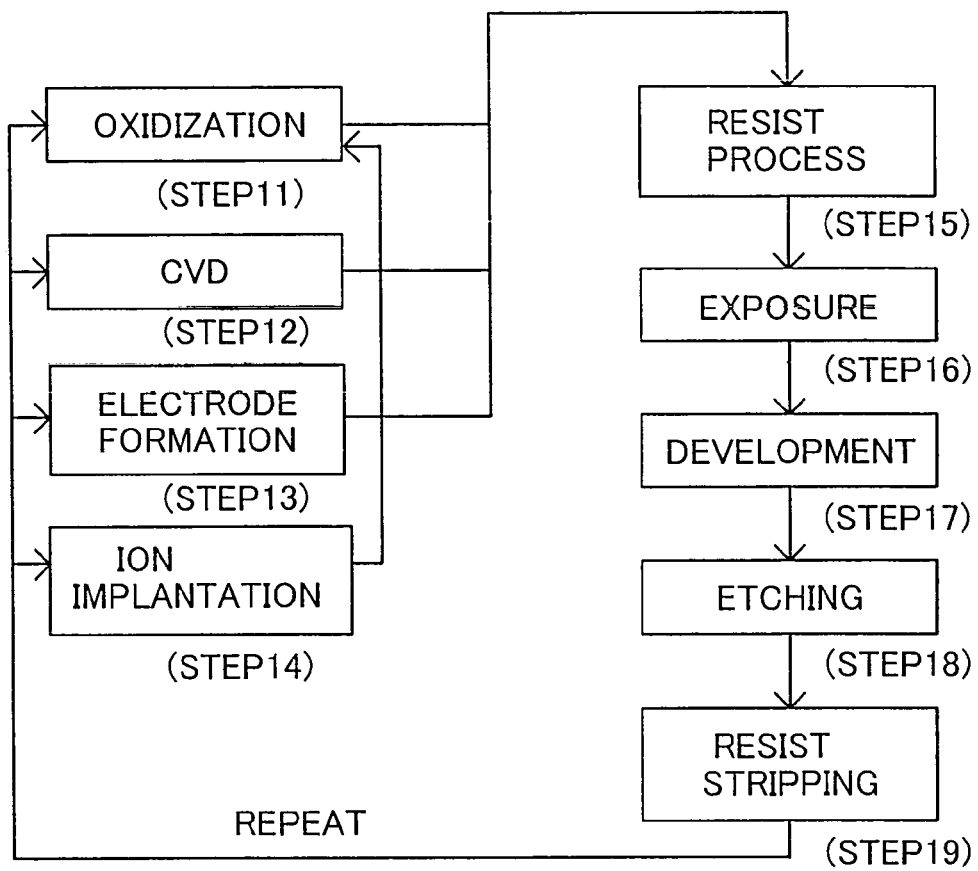
FIG. 6 is a detail flowchart of a wafer process as Step 4 shown in FIG. 5.
Figure 7:
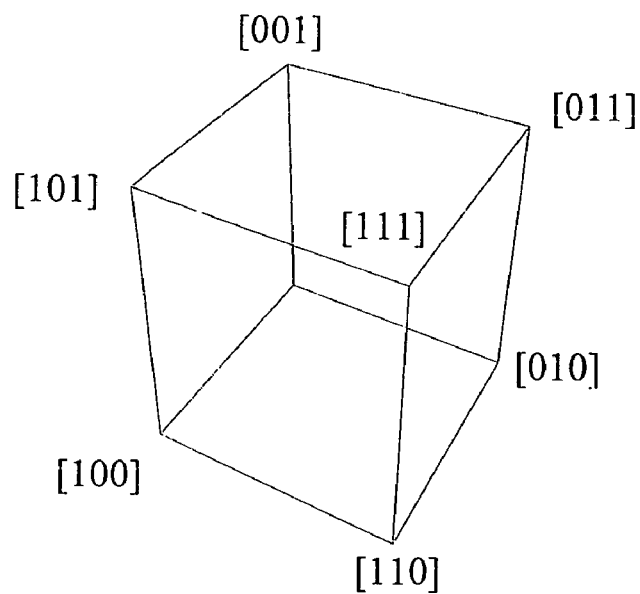
FIG. 7 is a view for explaining crystal axes in calcium fluoride.
Figure 8:
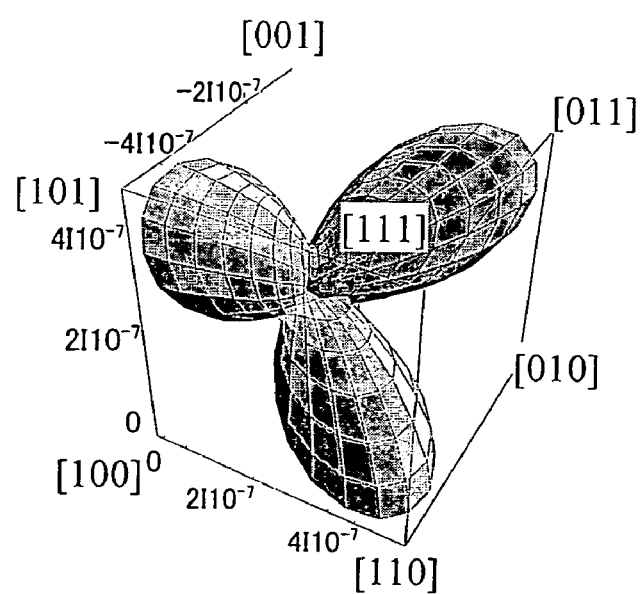
FIG. 8 is a view of an intrinsic birefringence amount distribution in calcium fluoride.
Figure 9:
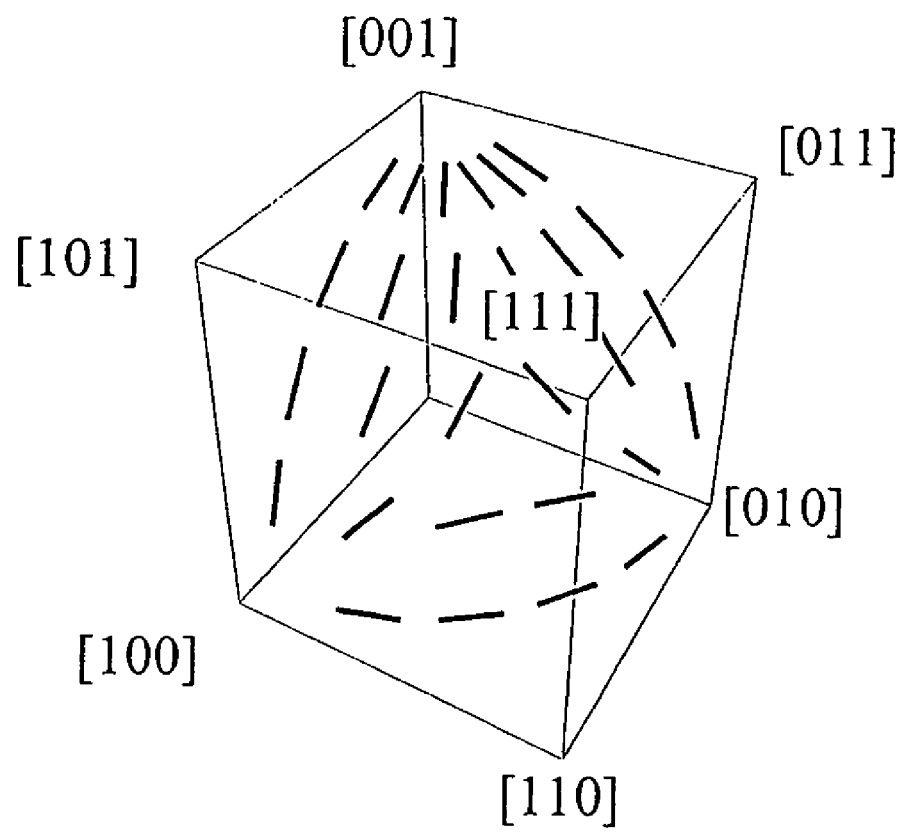
FIG. 9 is a view of intrinsic birefringence phase advance axes in calcium fluoride.

Referring now to FIGS. 5 and 6, a description will be given of an embodiment of a device fabricating method using the above exposure apparatus. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of the instant embodiment maintains the intended imaging performance and fabricates higher quality devices than conventional.

Further, the present invention is not limited to these preferred embodiments, and various modifications and changes may be made in the present invention without departing from the spirit and scope thereof. For example, the projection optical system may use a step-and-repeat exposure apparatus (referred to as a "stepper") that exposes while maintaining the reticle and plate in a stationary state.

INDUSTRIAL APPLICABLITY

The inventive projection optical system may reduce the influence of the residual intrinsic birefringence in the optical system and maintain the intended imaging performance. Another embodiment has an additional effect of restraining cost increase by reducing use frequency of an optical element that orients a crystal axis other than the crystal axis [1 1 1]. The exposure apparatus using this projection optical system may provide high quality devices with good exposure performance.

The invention claimed is:

1. A projection optical system comprising:
   a first optical element that orients an axis [1 1 1] as a crystal orientation in a cubic system crystal parallel to an optical axis; and
   a second optical element that orients an axis [1 0 0] as the crystal orientation in the cubic system crystal so that the angle between the optical axis and an off-axis edge beam that passes through the second optical element is greater than or equal to 30°, and the angle between the optical axis and an off-axis principal ray that passes through the second optical element is less than or equal to 10°.

2. A projection optical system according to claim 1, wherein the first and second optical elements are adapted rotatable around the optical axis.

3. A projection optical system according to claim 1, wherein the cubic system crystal is calcium fluoride.

4. A projection optical system according to claim 1, wherein the number of first optical elements is larger than the number of second optical elements.

5. A projection optical system according to claim 4, wherein the number of first optical elements is 10 or more, and the second optical elements is 5 or less.

6. A projection optical system according to claim 4, wherein the number of second optical elements is 3 or less.

7. A projection optical system according to claim 6, wherein the number of second optical elements is 1.

8. A projection optical system according to claim 1, wherein the second optical element is located closest in the projection optical system to a reduction conjugate side.

9. A projection optical system according to claim 1, wherein plural continuous optical elements closest to a reduction conjugate side in the projection optical system form the second optical element.

10. A method for correcting intrinsic birefringence in a projection optical system that includes plural optical elements of a cubic system crystal, said method comprising the steps of:
    arranging one optical element in said plural optical elements that orients an axis [1 1 1] as a crystal orientation in the cubic system crystal is parallel to an optical axis; and
    arranging another optical element that orients an axis [1 0 0] as the crystal orientation in the cubic system crystal in said plural optical elements so that the angle between the optical axis and an off-axis edge beam that passes through the other optical element is greater than or equal to 30°, and the angle between the optical axis and an off-axis principal ray that passes through the other optical element is less than or equal to 10°.

11. A method according to claim 10, further comprising one of the plural optical elements around the optical axis.

12. An exposure apparatus comprising:
    an illumination optical system for illuminating a mask or reticle that forms a predetermined pattern; and
    a projection optical system for imaging light from said illumination optical system,
    wherein said projection optical system includes:
    a first optical element that orients an axis [1 1 1] as a crystal orientation in a cubic system crystal parallel to an optical axis; and
    a second optical element that orients an axis [1 0 0] as the crystal orientation in the cubic system crystal so that the angle between the optical axis and an off-axis edge beam that passes through the second optical element is greater than or equal to 30°, and the angle between the optical axis and an off-axis principal ray that passes through the second optical element is less than or equal to 10°.

13. A device fabricating method comprising the steps of:
    exposing an object using an exposure apparatus; and
    performing a predetermined process for the exposed object,
    wherein an exposure apparatus includes an illumination optical system for illuminating a mask or reticle that forms a predetermined pattern, and a projection optical system for imaging light from said illumination optical system,
    wherein said projection optical system includes:
    a first optical element that orients an axis [1 1 1] as a crystal orientation in a cubic system crystal parallel to an optical axis; and
    a second optical element that orients an axis [1 0 0] as the crystal orientation in the cubic system crystal so that the angle between the optical axis and an off-axis edge beam that passes through the second optical element is greater than or equal to 30°, and the angle between the optical axis and an off-axis principal ray that passes through the second optical element is less than or equal to 10°.

* * * * *